(12) United States Patent
Fouillet

(10) Patent No.: US 8,679,423 B2
(45) Date of Patent: Mar. 25, 2014

(54) METHOD FOR PRODUCING RECONFIGURABLE MICROCHANNELS

(75) Inventor: Yves Fouillet, Voreppe (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 194 days.

(21) Appl. No.: 12/988,213

(22) PCT Filed: Apr. 23, 2009

(86) PCT No.: PCT/EP2009/054884
§ 371 (c)(1),
(2), (4) Date: Jan. 4, 2011

(87) PCT Pub. No.: WO2009/130274
PCT Pub. Date: Oct. 29, 2009

(65) Prior Publication Data
US 2011/0104025 A1    May 5, 2011

(30) Foreign Application Priority Data
Apr. 24, 2008 (FR) ..................... 08 52766

(51) Int. Cl.
*B03C 9/00* (2006.01)
*B01L 3/00* (2006.01)

(52) U.S. Cl.
USPC .......... 422/504; 422/502; 422/503; 204/450; 204/547; 204/600

(58) Field of Classification Search
USPC .................... 137/803, 827; 204/279–281
See application file for complete search history.

(56) References Cited

U.S. PATENT DOCUMENTS

| | | | |
|---|---|---|---|
| 4,569,575 A | 2/1986 | Le Pesant et al. |
| 5,376,252 A | 12/1994 | Ekström et al. |
| 5,569,364 A | 10/1996 | Hooper et al. |
| 5,781,994 A | 7/1998 | Fouillet et al. |
| 5,818,623 A | 10/1998 | Valette et al. |
| 6,395,557 B1 | 5/2002 | Fouillet et al. |

(Continued)

FOREIGN PATENT DOCUMENTS

| | | |
|---|---|---|
| DE | 10 2004 007 274 A1 | 9/2005 |
| EP | 0 754 959 A1 | 1/1997 |

(Continued)

OTHER PUBLICATIONS

Lin et al., Integrated Digital and Analog Microfluidics by EWOD and LDEP, Proceedings of the 1$^{st}$ IEEE International Conference on Nano/Micro Engineered and Molecular Systems, Jan. 18-21, 2006, Zuhai, China, p. 1414-1417.*

(Continued)

*Primary Examiner* — In Suk Bullock
*Assistant Examiner* — Robert Eom
(74) *Attorney, Agent, or Firm* — Oblon, Spivak, McClelland, Maier & Neustadt, L.L.P.

(57) ABSTRACT

A microfluidic device, including a microfluidic network, including: a) two parallel plates each including one or more electrodes, b) at least one channel, arranged between the two plates, made from a material obtained by solidification or hardening of a material of a first fluid, and c) a mechanism varying a physical parameter of the material constituting walls of the channel so as to cause the material to pass at least from the liquid state to the solid state.

11 Claims, 9 Drawing Sheets

(56) References Cited

U.S. PATENT DOCUMENTS

| | | | |
|---|---|---|---|
| 6,680,193 | B1 | 1/2004 | Fouillet et al. |
| 6,722,580 | B1 | 4/2004 | Fouillet et al. |
| 6,887,384 | B1 | 5/2005 | Frechet et al. |
| 7,015,030 | B1 | 3/2006 | Fouillet et al. |
| 7,052,244 | B2 | 5/2006 | Fouillet et al. |
| 7,211,223 | B2 | 5/2007 | Fouillet et al. |
| 7,235,405 | B2 | 6/2007 | Charles et al. |
| 7,842,235 | B2 | 11/2010 | Ocvirk et al. |
| 7,875,160 | B2 | 1/2011 | Jary |
| 2002/0043805 | A1 | 4/2002 | Charles et al. |
| 2002/0153251 | A1 | 10/2002 | Sassi et al. |
| 2003/0082081 | A1 | 5/2003 | Fouillet et al. |
| 2003/0136451 | A1* | 7/2003 | Beebe et al. ............ 137/828 |
| 2004/0053418 | A1 | 3/2004 | Fouillet et al. |
| 2004/0076525 | A1 | 4/2004 | Olivier et al. |
| 2004/0096359 | A1 | 5/2004 | Sarrut et al. |
| 2004/0115861 | A1 | 6/2004 | Wong et al. |
| 2005/0035598 | A1 | 2/2005 | Charles et al. |
| 2005/0046541 | A1 | 3/2005 | Fouillet |
| 2005/0179746 | A1 | 8/2005 | Roux et al. |
| 2005/0196328 | A1 | 9/2005 | Fouillet et al. |
| 2005/0254997 | A1 | 11/2005 | Ocvirx et al. |
| 2005/0282224 | A1 | 12/2005 | Fouillet et al. |
| 2006/0011478 | A1 | 1/2006 | Fouillet et al. |
| 2007/0077771 | A1 | 4/2007 | Plissonnier et al. |
| 2008/0142376 | A1 | 6/2008 | Fouillet et al. |
| 2008/0185296 | A1 | 8/2008 | Sauter-Starace et al. |
| 2008/0295687 | A1 | 12/2008 | Galbrun et al. |
| 2008/0302431 | A1 | 12/2008 | Marchand et al. |
| 2009/0127123 | A1 | 5/2009 | Raccurt et al. |
| 2009/0134009 | A1 | 5/2009 | Roux et al. |
| 2009/0142564 | A1 | 6/2009 | Plissonnier et al. |
| 2009/0192044 | A1 | 7/2009 | Fouillet |
| 2009/0283474 | A1 | 11/2009 | Achard et al. |
| 2010/0000620 | A1 | 1/2010 | Fouillet et al. |
| 2010/0104459 | A1 | 4/2010 | Fouillet et al. |
| 2010/0295415 | A1 | 11/2010 | Despesse et al. |
| 2010/0320088 | A1 | 12/2010 | Fouillet et al. |
| 2011/0036153 | A1 | 2/2011 | Ocvirk et al. |

FOREIGN PATENT DOCUMENTS

| | | |
|---|---|---|
| EP | 1 170 542 A1 | 1/2002 |
| FR | 2 548 431 | 1/1985 |
| FR | 2 795 426 | 12/2000 |
| FR | 2 796 863 | 2/2001 |
| FR | 2 798 604 | 3/2001 |
| FR | 2 798 867 | 3/2001 |
| FR | 2 799 139 | 4/2001 |
| FR | 2 813 073 | 2/2002 |
| FR | 2 816 525 | 5/2002 |
| FR | 2 841 063 | 12/2003 |
| FR | 2 884 242 | 10/2006 |
| FR | 2 884 243 | 10/2006 |
| FR | 2 887 705 | 12/2006 |
| FR | 2 887 983 | 1/2007 |
| FR | 2 888 912 | 1/2007 |
| WO | WO 91/16966 | 11/1991 |
| WO | WO 94/10561 | 5/1994 |
| WO | WO 98/43465 | 10/1998 |
| WO | WO 02/060584 A2 | 8/2002 |
| WO | WO 2006/005881 A1 | 1/2006 |
| WO | WO 2007/003720 A1 | 1/2007 |
| WO | WO 2007/012638 A1 | 2/2007 |

OTHER PUBLICATIONS

French Preliminary Search Report issued Nov. 18, 2008, in Patent Application No. 0852766 (with English Translation of Category of Cited Documents).

T. B. Jones, et al., "Frequency-Based Relationship of Electrowetting and Dielectrophoretic Liquid Microactuation", Langmuir, vol. 19, No, 18, 2003, pp. 7646-7651.

Yves Fouillet, et al., "Digital microfluidic design and optimization of classic and new fluidic functions for lab on a chip systems", Microfluid Nanofluid, vol. 4, 2008, pp. 159-165.

Mathieu Joanicot, et al., "Droplet Control for Microfluidics", Applied Physics, Science, vol. 309, Aug. 5, 2005, pp. 887-888.

Robin Hui Liu, et al., "Self-Contained, Fully Integrated Biochip for Sample Preparation, Polymerase Chain Reaction Amplification, and DNA Microarray Detection", Analytical Chemistry, vol. 76, No. 7, Apr. 1, 2004, pp. 1824-1831.

Vijay Srinivasan, et al., "An integrated digital microfluidic lab-on-a-chip for clinical diagnostics on human physiological fluids", Lab Chip, vol. 4, 2004, pp. 310-315.

\* cited by examiner

METHOD FOR PRODUCING RECONFIGURABLE MICROCHANNELS

TECHNICAL FIELD AND PRIOR ART

The invention relates to the microfluidics field.

In this field, the known devices generally use technologies of the MEMS type. The channels are produced by assembling together two plates, one of the plates having been etched in order to form grooves.

According to another family of devices, a network of microchannels is formed by replication techniques such as the moulding of polymeric materials (for example polycarbonate). Other materials such as PDMS can be cast in micromachined moulds, etc.

In all these known devices, the geometry of the microfluidic network is defined at the time of conception.

The manufacture thereof requires equipment of the clean room type, which involves considerable means and long manufacturing times.

For a new component geometry, it is therefore necessary to carry out a new cycle of conception, production, packaging, etc. This cycle is long (from one week to several months) and expensive, which has a detrimental effect on the progress of a project. The component is generally discarded after a single use.

Techniques are known for manipulating liquid in the form of droplets, which forms what is known as discrete or discontinuous microfluidics. This makes it possible to manipulate droplets actuated by electrical forces. This technique is different from the so-called microchannel microfluidics to which this patent relates.

In all the known techniques, the surfaces may be contaminated by chemical or biological reactions and the microfluidic component cannot be reused.

For applications in the medical diagnostics field, the components usually used are often designed for one single use. This involves a constraint with regard to a low cost of manufacture, which is unfortunately incompatible with MEMS technologies.

SUMMARY OF THE INVENTION

The invention aims to propose a device which can be produced very easily and which can be rapidly configured as a function of the requirements of a user, without involving cumbersome and laborious manufacturing processes.

The invention relates firstly to a method for producing a microfluidic network, including at least a first microfluidic channel, which method comprises:

a) introducing a first fluid and a second fluid between two plates provided with electrodes, these two fluids being immiscible, the first fluid being a liquid that can be hardened or solidified, b) the interface between the two fluids being shaped by means of the electrodes so as to form at least said first fluidic flow channel, c) solidifying or hardening the material of said first fluid.

The second fluid can be eliminated.

According to the invention, a component or a microfluidic network is formed in the gap between two plates arranged parallel to one another and comprising electrodes.

The invention makes it possible to manufacture a component comprising reconfigurable or reusable channels. The shaping of the channels and of the network of channels is controlled by electrical forces.

A first fluid material is arranged between the two plates. By virtue of the electrical forces and the second fluid, the shape of this fusible material (still in the fluid state) is imposed with the aim of defining a network of microchannels. This shaping can then be fixed, by polymerisation, hardening or crystallisation of the fusible material. The component thus comprises a microfluidic network formed of solid walls.

The first and second fluids may be both insulating, or else both conductive. In the latter case, the conductivity of the first fluid is different or very different from that of the second fluid. As a variant, one is insulating and the other is conductive.

In the solid state, the material of the first fluid may be fusible. A method according to the invention may then additionally comprise a step of fluidising the solidified material of said first fluid.

It is then possible to eliminate the first fluid and to replace it with a third fluid, which is for example also liquid and can also be hardened or solidified.

It is possible to repeat steps b) and c) using the first fluid or the third fluid and a second fluid which is immiscible with the first fluid or the third fluid. It is also possible to shape the first fluid or the third fluid, by means of the electrodes and the second fluid, so as to form at least a second fluidic flow channel, different from the first.

Since the change between the liquid state and the solid state is optionally reversible, it is then possible to reconstruct an identical microfluidic network, obtained according to the invention, by renewing the fusible material or else to construct another microfluidic network which is different from the previous one.

One and the same component produced according to the invention can therefore be reused a large number of times with a large variety of geometries of microfluidic networks. The formation of each microfluidic network is quick and does not require any micromanufacturing equipment.

The microfluidic network which can be produced using such a method may comprise various elements such as for example one or more pillars in a channel and/or one or more closed chambers and/or a convergent then divergent section and/or a narrowing or a constriction in at least one channel, and/or at least one serpentine-shaped channel.

The invention also relates to a microfluidic device, including a microfluidic network, comprising:

a) two plates or substrates, each being equipped with one or more electrodes, b) at least one channel, the walls of which are made from a material obtained by the solidification or hardening of the material of a first fluid.

Means may be provided for varying a physical parameter of the material constituting the walls of the channel so as to cause this material to pass at least from the liquid state to the solid state.

These means are not necessarily integrated in the device. They may be means external to the device (UV lamp, or external heating means, etc.).

As a variant, the invention also relates to a microfluidic device, including a microfluidic network, comprising:

a) two plates or substrates, each being equipped with one or more electrodes, b) at least one channel having solid walls, c) means for varying a physical parameter of the material constituting the walls of the channel so as to cause this material to pass at least from the liquid state to the solid state, these means being integrated in the device or being external to the device (UV lamp, or external heating means, etc. . . . ).

In a method and a device according to the invention, the first fluid, or the material constituting the walls of the device, may be an adhesive, for example of the epoxy type, or silicone, or a resin, or a UV adhesive or an insulating adhesive or a gel, for example alginate or agarose, or a polymer, for example PDMS, or a liquid-solid phase change material, for example a material having a phase transition temperature between 50° C. and 150° C., for example paraffin, optionally loaded with conductive particles, or polycarbonate, or a metal or an alloy based on tin and/or lead.

The second fluid may be a gas, for example air, or an insulating fluid, such as oil, or a conductive fluid, such as water or an aqueous solution.

The invention makes it possible to form a microfluidic network of channels in a non-disposable component with the following advantages:
- the geometry of the microfluidic network can be imposed, produced and modified by the user without having to use technological means of the clean room type (for example techniques of the photolithography and/or etching type, etc. . . . ),
- the formation and the remelting of the microfluidic network is a fast process,
- between two uses, the user can form a new microfluidic network which is identical or different,
- the material forming the walls can be renewed between each melting, which makes it possible to reuse the component if the microfluidic network has been damaged, contaminated, blocked up, etc.

DETAILED DESCRIPTION OF PARTICULAR EMBODIMENTS

Figure 1A:
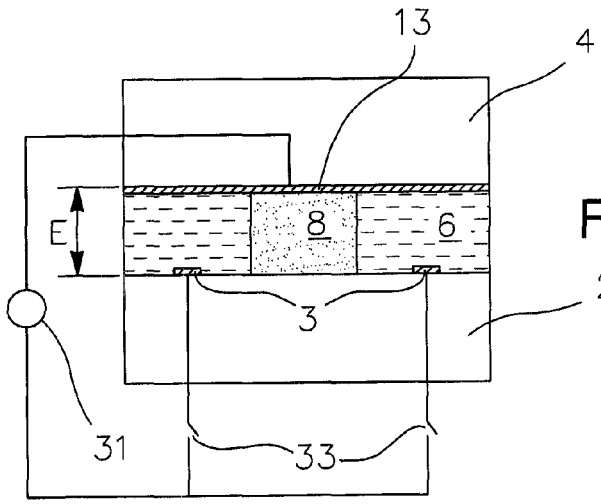
FIGS. 1A-1D show steps of a method for producing a device according to the invention, in a configuration for activation by liquid dielectric force (FIGS. 1A, 1B) and in a configuration for activation by electrowetting (FIGS. 1C, 1D)
Figure 1B:
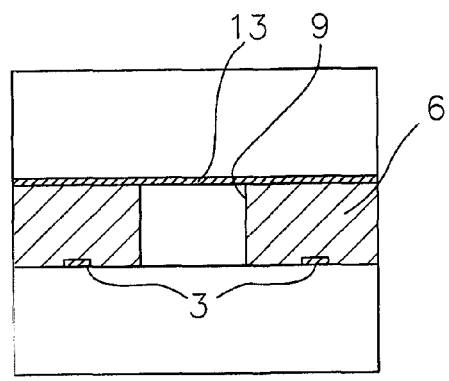

A first example of embodiment of the invention is shown schematically in FIGS. 1A and 1B.

These figures show, in section, a device comprising two parallel substrates or plates 2, 4, between which a channel 9 is defined. A single channel is shown, but the invention applies to the production of any configuration of channels, for example of the type shown in plan view in any one of FIGS. 12A-12C.

Two immiscible fluid media 6, 8 are arranged in the space defined between the two parallel plates (or substrates) 2, 4, each of these plates comprising one or more electrodes 3, 13 (FIG. 1A). Hereinbelow, the fluid 6 may be denoted by the expression "first fluid" and the fluid 8 may be denoted by the expression "second fluid".

The electrodes may be in direct contact with the medium separating the two plates. This is the case for the electrodes 3, 13 in FIGS. 1A and 1B. The preferred displacement mechanism for the fluids will then be of the DEP (dielectrophoresis) type.

Figure 1C:
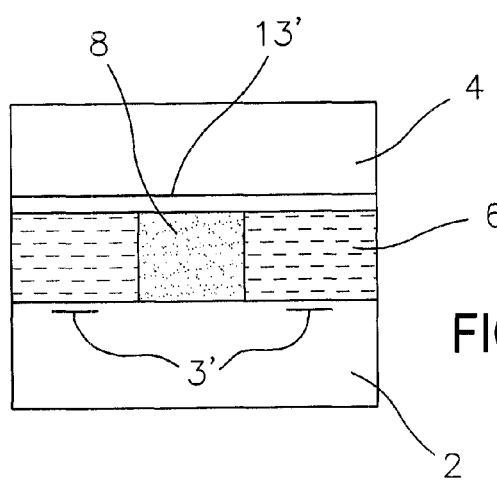
Figure 1D:
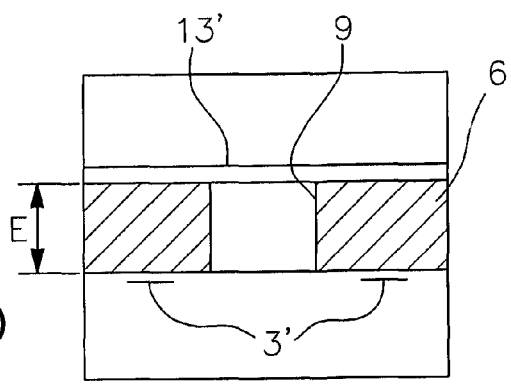

As a variant, the electrodes 3', 13' are buried in the substrates 2, 4 (situation in FIGS. 1C, 1D). The preferred displacement mechanism for the fluids will then be of the electrowetting type. The fact that the electrodes are buried in the substrates 2, 4 makes it possible to create an insulation by insulating layers and thus to prevent any risk of electrolysis of the conductive medium.

The article by Jones et al., "Frequency-based relationship of electrowetting and dielectrophoretic liquid microactuation", *Langmuir*, 19, 7646-51, 2003 provides explanations concerning the forces used in the case of a displacement of the DEP type and that used in the case of a displacement by electrowetting (EWOD). In both cases, use is made of the electrostatic stresses applied to the interface between the first and second fluids.

In both cases, the electrodes 3, 3', 13, 13' may be connected to means for selectively applying a voltage to each electrode, for example switching means 33 and voltage generating means 31 (see FIG. 1A, these means are not shown in the other figures).

Also in both cases, the distance E between the two plates or substrates 2, 4 may be between 1 µm and 500 µm; it is for example around 100 µm.

Typically, when the fluids are activated by DEP, the potential difference between the electrodes 3 associated with the substrate 2 and the electrode 13 associated with the substrate 4 is between 100 V or a few hundred V, for example 500 V, and 1000 V or a few thousand V, for example 5000 V, for a distance E of around 100 µm.

When the fluids are actuated by electrowetting, the potential differences between the electrodes 3' and the electrode 13' are around ten Volts, for example between 10 V and 50 V, typically 40 V for an insulator thickness of 1 µm.

In all the figures, the electrode associated with the substrate or plate 4 is shown as being a single electrode. As a variant, this substrate may also comprise a plurality of electrodes, opposite the electrodes 3.

The first fluid medium 6 may be a liquid material having the property of solidifying or hardening as a result of modification of one of its physical parameters, for example as a result of a decrease or increase in temperature, or as a result of insolation under a specific radiation range, for example photonic radiation, in particular UV. Means are provided in the device for bringing about such a modification, these being for example temperature control means. These means are arranged on or in at least one of the substrates 2, 4 or in the space between the substrates. They may also be external means, in particular in the case of UV insolation, using for example commercially available adhesives and lamps (see for example the products offered by the company Adler SA). It may be provided that one of the abovementioned physical parameters of the fluid is kept at a first level, so as to keep the material in fluid form, and then said parameter is varied in order to cause said material to pass into the solid form. Means may therefore be provided for keeping this physical parameter of the fluid at a first level, for example a temperature which enables it to be in liquid form, and then for varying said parameter, for example for causing the temperature to change so as to cause this material to pass into the solid form.

The second fluid medium 8 will make it possible, with the aid of the electrodes, to define in the first fluid medium 6 the geometry of the desired channel 9.

More specifically, the interface between the two fluids 6 and 8 is shaped by the electrostatic forces by virtue of the electrodes 3, 13, 3', 13' and the voltages applied thereto, in the context of fluid displacement of either the DEP type or the electrowetting type. The channel or channels to be produced can thus be given any desired shape.

The solidification of the first fluid medium 6 makes it possible to fix the shape of this channel or these channels. It is then possible to evacuate the second fluid 8 (FIGS. 1B and 1D). The walls of these channels therefore remain, which are formed by the solidified or hardened material of the first fluid 6. Any shapes of channels or one or more networks of channels can thus be produced. In particular, it is possible to produce channels having a width or maximum dimension in the plane of FIGS. 1A-1D which is small compared to the length of the channel perpendicular to this plane. For instance, it can be clearly seen in FIGS. 4E, 6A-6C, 7A-7D, 9A-9D, 10B, 11C, 12B-12C, 14A, 14B that the channels produced may have an elongate or stretched shape, a droplet 42 of fluid (FIG. 14B) being able to flow in the direction of stretching of the channel while being guided by the side walls formed by the solidified fluid 6, 6'.

Examples of use or of application of the microfluidic component thus produced are given below. During use, and even simply after formation of the solid walls of the channels, the latter are well defined and it is no longer necessary to apply electrical forces in order to keep fixed the shape of the microfluidic network.

Once the device has been formed, and during use for transporting fluids or droplets, it will be possible to use the electrodes 3, 3', 13, 13' to control the diphasic flows or droplet flows in the microchannels produced.

After use of the component, for example to carry out medical or biological analyses, it is possible to dissolve the walls, for example by chemical attack on the first fluid medium 6. Then a new volume of fluid material 6 (and of the fluid 8) can be reinjected in order to once again form a new fluidic network according to the invention, according to what has been described above, in the same configuration of channels or in a different configuration of channels. The voltages applied to the electrodes 3, 3', 13, 13' are then adapted as a function of the desired new configuration.

Figure 2A:
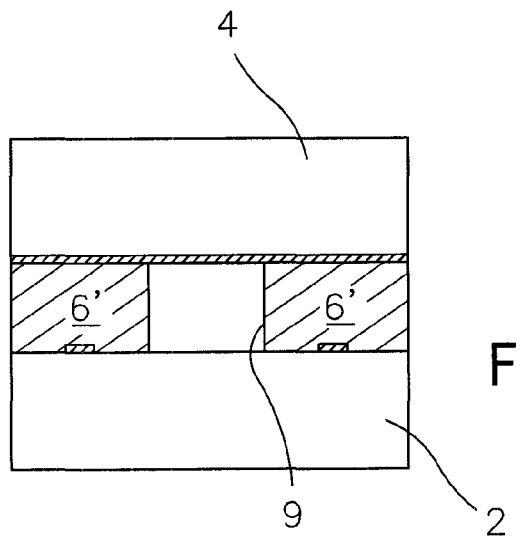
FIGS. 2A to 2B show steps of a variant of a method for producing a device according to the invention.
Figure 2B:
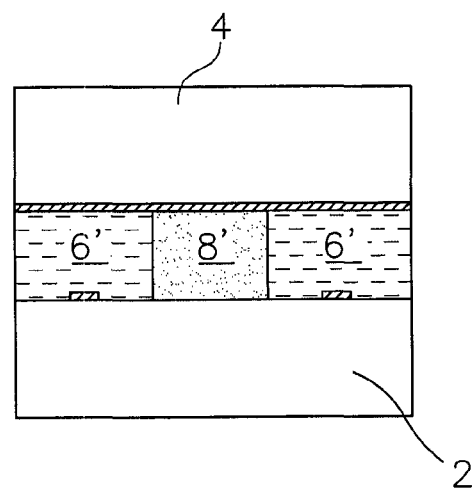

FIGS. 2A and 2B show a variant of this method. Once again there are the two plates 2, 4 and a channel defined by side walls made from a material 6', which can be made fluid or liquid. This time, this is a reversible phase change material. In the example shown in these two figures, a configuration with displacement by DEP has been selected, but the configuration with displacement by electrowetting is also possible.

A first configuration can be produced as explained above, by solidifying the material 6', once again by means of a first modification of a physical parameter such as the temperature. FIG. 2A illustrates this state with the material 6' solidified. This time, however, it is also possible to cause the medium 6' to pass back into the liquid state (FIG. 2B), by causing a second modification of said parameter in the direction opposite that of the first modification, and thus to reconfigure the microfluidic network, creating a new (second) network different from the first, at least one channel of which may have a shape and/or a geometry different from that of the first network created. A second fluid 8' (FIG. 2B) makes it possible once again to define the geometry of the desired channel, which is produced by solidification of the fluid 6'.

It is then possible to recreate the earlier microfluidic structure. As a variant, by changing the configuration of the electrical forces, it is possible to form a new microfluidic network, different from the earlier network.

The medium 6' may be renewed after each operation of melting the material constituting the microfluidic network, which makes it possible to reconstruct channels 9 with walls made from a clean or non-polluted material. Since the fluidisable medium 6' can be renewed at the time of each remelting, it is possible to reuse the same component a large number of times while minimising the risks of contamination or pollution of the component.

Figure 3:
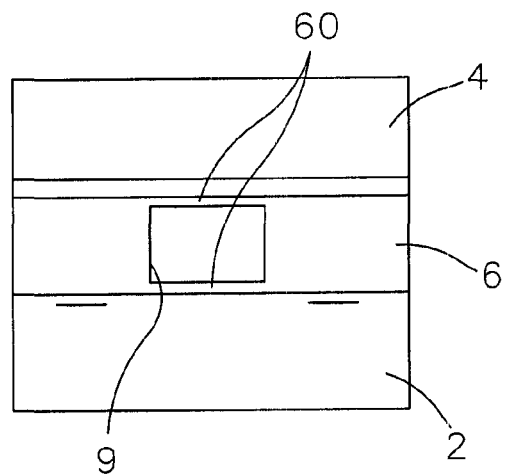
FIG. 3 shows a device according to the invention, in a configuration for activation by electrowetting, with total wetting of the walls by the hardenable liquid.

As shown in FIG. 3, the medium 6, 6' preferably has a high affinity with the walls of the two plates 2, 4 so as to maintain a total wetting of this medium (in the liquid state) on the surfaces. A very thin film 60 of this material then always exists on the surface of the plates 2, 4, even after solidification of the medium 6, 6' and elimination of the second fluid medium 8, 8'. After solidification, the channels will be entirely defined by walls formed by the medium 6, 6' (including the upper wall and lower wall).

The material of the medium 6, 6' is for example an adhesive (in particular of the epoxy type, or silicone, or a resin, etc.). Before hardening, these adhesives are made sufficiently fluid (fluidity for example between 1 centipoise and a few tens of centipoises, for example 50 cp) to facilitate the shaping of the material. By way of example, this material may be a UV adhesive. The hardening then takes place by insolation of the component by a UV light source. Reference adhesives and UV sources are available from a number of manufacturers, for example Photobond, Adler, Vitralit. By way of example, mention may be made of the UV adhesive 6127N from Adler S. A. At least one of the plates 2, 4 is then transparent and the UV light source is placed facing the adhesive.

Another example of a material for the medium 6 is a gel (in particular alginate, or agarose, etc.). This may also be a polymer, such as PDMS for example.

The medium 6 may also be a liquid-solid phase change material. A material which has a phase transition temperature that is acceptable to the entire component and can easily be attained by the user will preferably be chosen. This transition temperature may therefore be around a few tens of ° C., for example between 50° C. and 150° C.

For example, the material of the medium 6 is paraffin, the transition temperature of which is substantially 60°. According to another example, this material is polycarbonate, or a metal or an alloy based on tin and/or lead, etc.: each of these materials has a transition temperature greater than 100° C.

The medium 8 may be a gas (air). This may be an insulating fluid, such as oil or water or an aqueous solution.

The material 8 is preferably selected as a function of the material 6 so as to be able to apply an electrical force to the interface of the two fluids.

The two fluids 6, 8 may be insulating, with different dielectric permittivities, the constant $\in$ of the first fluid medium 6 being greater than the constant $\in$ of the second fluid medium 8. In this case, the electrodes are arranged below the first fluid medium 6, as in FIG. 1A, and the mode of actuation of the fluids is DEP. By way of example, the material 6 is paraffin, or an insulating adhesive, or polycarbonate or PDMS, etc.; and the material 8 is air or an inert gas or any insulating fluid that is immiscible with the material 6. The phenomenon of liquid DEP is then used to shape the interface between these two fluids and to control the geometry of this interface. In the case of a pair consisting of paraffin (material 6) and air (material 8), the electrodes 3 are arranged below the paraffin. In the case of paraffin (material 6) and oil (or more generally any other material as material 8), the electrodes 3 may be arranged below the oil 8 (or more generally below the other material 8) if the dielectric permittivity of the material 8 is higher than that of the paraffin 6.

According to another example, just one of the two materials 6, 8 is conductive; the conductive material may be the material 6 or the material 8. Electrowetting is then used to control the geometry of the interface between these two materials. In this case, the electrodes 3' will be arranged not below the interface 6-8 but rather below the one of the two fluid media 6, 8 that is conductive (or that is the most conductive).

A paraffin-(salt water) pair is possible. It is also possible to use a pair consisting of paraffin (loaded with conductive particles) and air. Other possible pairs are as follows:
- for the material 6: a metal (for example: tin, lead, etc.) or a paraffin loaded with conductive particles (for example microbeads, or carbon particles, or carbon nanotubes, or silicon, etc.), or a conductive adhesive,
- for the material 8: air or an organic liquid, for example an oil.

One example of embodiment of a starting component for implementing the invention will be given in connection with FIGS. 4A-4E.

For this first example, two insulating fluids 6, 8 are used, and the interface is therefore manipulated by liquid DEP.

Figure 4A:
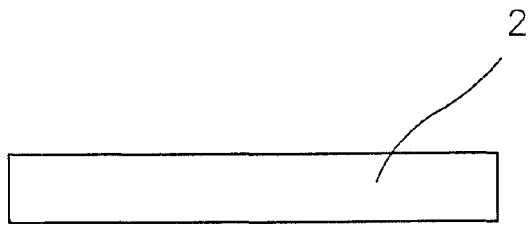
FIGS. 4A-4E show some production steps of another method according to the invention.
Figure 4B:
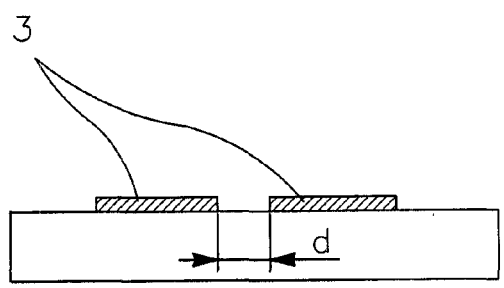
Figure 4C:
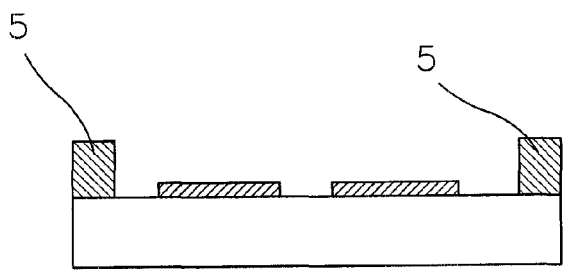
Figure 4E:
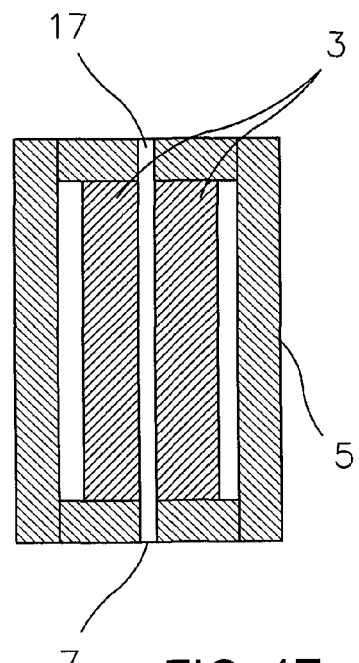
Figure 4D:
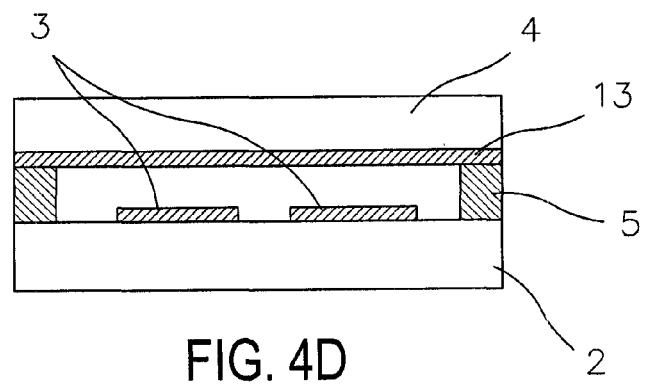

The fluidic component is formed by two parallel plates 2, 4 (FIG. 4D). These plates may be made for example from glass, or silicon, or polycarbonate, or epoxy (of the printed circuit board type).

Electrodes 3 (FIG. 4B) are formed on the first plate 2 (FIG. 4A). These electrodes 3 are obtained by a structured layer of a conductive material, for example made from ITO (transparent conductive layer). The structure of the electrodes makes it possible to define the zones in which the DEP forces will act.

In the example of FIG. 4B, these electrodes 3 are simply formed of two parallel strips spaced apart by a distance d of between a few microns, for example 5 µm, and a few millimeters, for example 10 mm. This spacing corresponds to the width of the desired fluidic channel 9. One or more electrodes 13 may also be formed on the other plate (upper plate 4) (FIG. 4D).

Spacer means 5 are then formed on one of the two plates (FIG. 4C). These are obtained for example by a layer of resin 5 having a controlled thickness of from a few microns, for example 5 µm, to a few hundred microns, for example 500 µm. For example, a film of photosensitive resin is laminated onto the plate 2 and then structured by photolithography.

The two plates 2, 4 are then assembled (FIG. 4D) and bonded together so to form a cavity.

Openings 7, 17 are provided for injecting fluids into this cavity. These openings may be obtained by piercing one of the plates 2, 4 or walls constituting the spacer means 5, as illustrated in the plan view of FIG. 4E.

Means (not shown) are provided for forming an electrical interface between the component and an electrical control system. Said interface comprises for example spot contacts or electrical wires.

Other means are provided for controlling the temperature of the component. For example, a Peltier-effect element (not shown in the figures) is pressed against the lower plate 2 of the component.

Figure 5A:
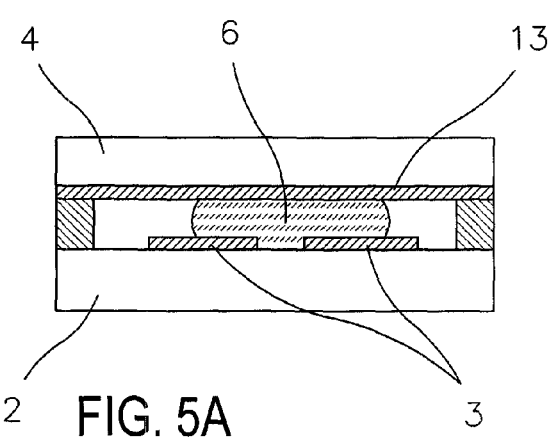
FIGS. 5A-5C show, in a sectional view, steps for producing a device according to the invention.
Figure 5B:
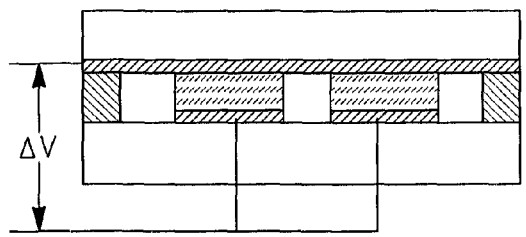
Figure 5C:
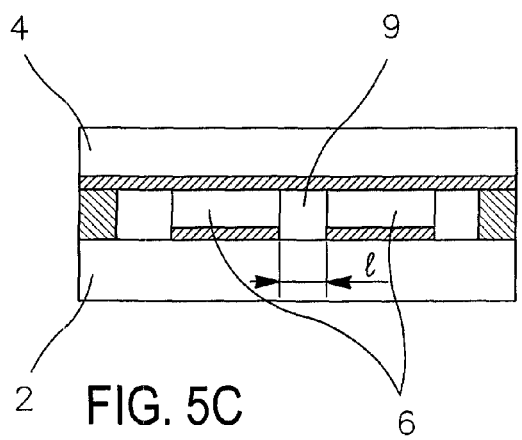

One example of use of this component will be described in connection with FIGS. 5A-5C (side views) and 6A-6C (plan views).

Figure 6A:
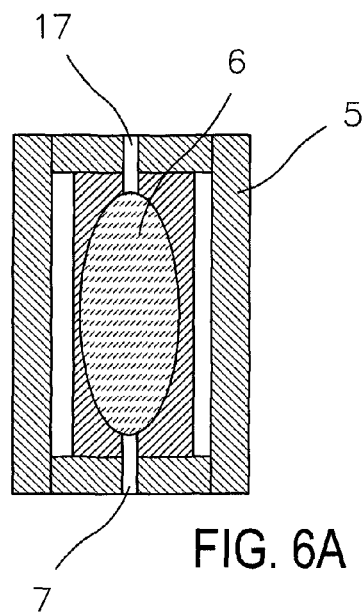
FIGS. 6A-6C show, in a plan view, steps for producing a device according to the invention.

In a first step, the component is filled with a fusible insulating material 6. The latter is injected in the liquid state into the space between the two substrates 2, 4 through one of the side openings 7, 17 (FIG. 5A and FIG. 6A).

The chip is then kept at a temperature above the melting point of the fusible liquid 6 by virtue of heating means provided for this purpose.

Figure 6B:
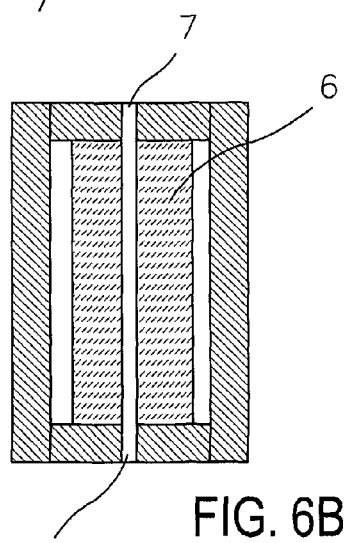

In a second step, the fusible liquid is electrically actuated. A voltage $\Delta V$ is applied between the electrodes 3 of the lower substrate and the electrode 13 of the upper substrate (FIG. 5B and FIG. 6B). Since the liquid 6 is insulating and has a dielectric permittivity greater than that of the fluid 8, the DEP forces tend to attract it towards the lower electrodes 3. The volume of fusible liquid then matches the shape of the electrodes.

Figure 6C:
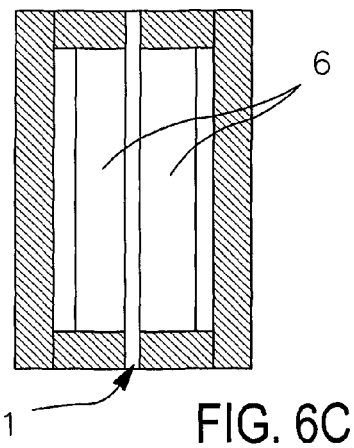

In a third step, the microchannel 9 will be formed by solidifying the fusible liquid 6. The temperature of the chip is lowered and the liquid 6 solidifies, thus forming a channel 9 with solid walls (FIG. 5C and FIG. 6C). The channel formed has a width 1 equal to the gap between the two electrodes 3 of the lower plate 2.

The fusible liquid 6 is for example paraffin, the liquid-solid transition temperature of which is from 40 to 70° C., depending on the composition or the additives. Paraffins also exist which have melting temperatures of around 90° C. (for example: Apieson®), and which can also be used in the context of the invention.

One variant of this example of use is shown in FIGS. 7A-7D.

Figures 7A, 7B, 7C, 7D:
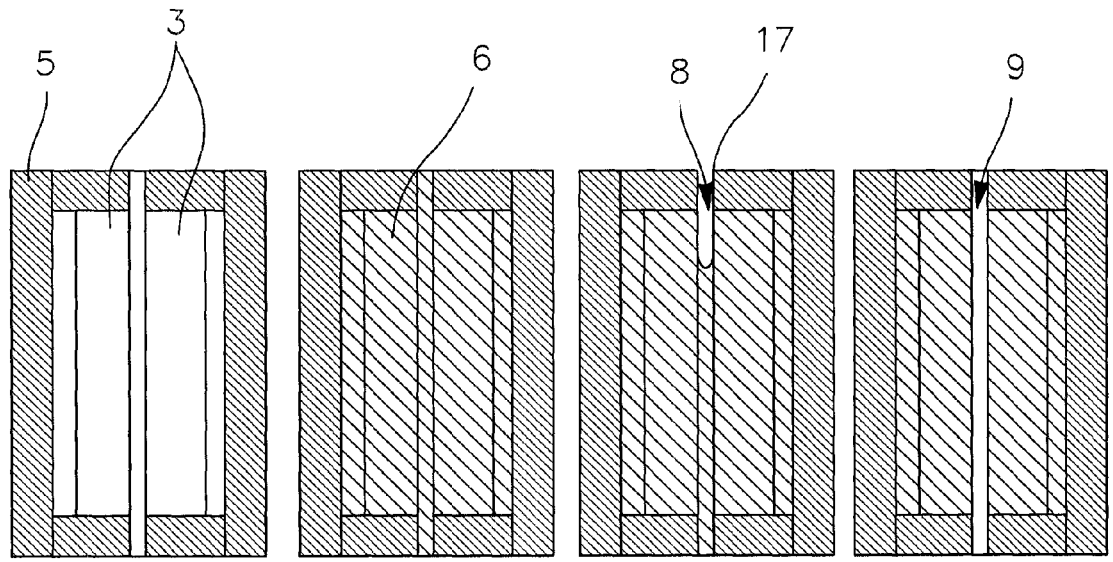
FIGS. 7A-7D shows steps for producing a device according to the invention.

The fluidic component is firstly formed in the manner explained above (FIGS. 4D and 4E); this is the structure of FIG. 7A.

The cavity thereof is then completely filled with the fusible medium 6 (FIG. 7B).

A voltage is applied between the electrodes 3 of the lower plate 2 and the electrode 13 of the upper plate 4.

The fluid 8 is injected through one of the orifices 17 (FIG. 7C). During this injection, the interface between the two fluids 6, 8 is guided by the DEP forces. This interfaces stretches so as to align with the edges of the lower electrodes 3.

This process continues until the fluid 8 extends along the entire component (FIG. 7D). Finally, the channel formed has a width equal to the distance separating the two electrodes 3 of the lower plate 2.

By reducing the temperature, the medium 6 is solidified so as to fix the shape of the channel obtained.

Figure 8:
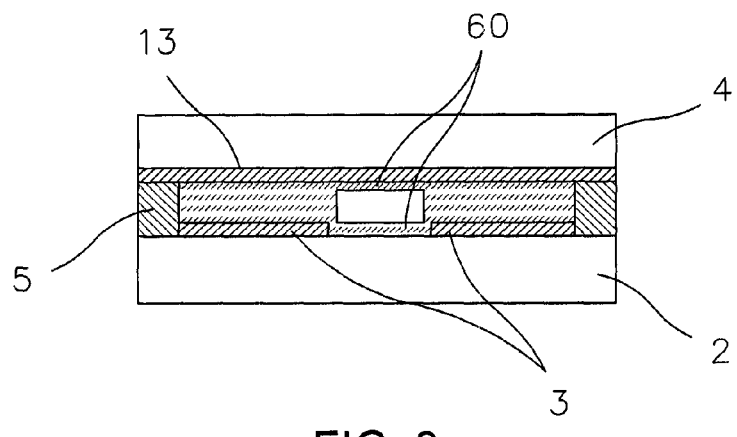
FIG. 8 shows a sectional view of a channel in a device according to the invention, with total wetting of the walls of the channel by the hardenable liquid.

FIG. 8 shows a variant in which the fusible material 6 has a high physicochemical affinity with the upper plate 4 and lower plate 2. More specifically, this material presents, in the liquid state, a total wetting on the walls and forms the film 60. When a droplet wets a surface with a total wetting configuration, and after a sufficient waiting period, a zero wetting angle is obtained and a very thin film 60 of liquid is formed (of nanometric or micrometric thickness) which results from a competition between the molecular and capillary forces.

To this end, the substrates 2, 4, the electrodes 3, 13 and a fusible material 6 are chosen in such a way that the latter—in the liquid state—is in the total wetting configuration on the surfaces of the substrates. Use may be made for example of paraffin, substrates made from glass and electrodes made from ITO. In this case, it has been found among the inventors that—from a microscopic point of view—a thin film 60 of paraffin always remains on the surface of the substrates 2, 4. This phenomenon may optionally be reinforced by applying a suitable surface treatment to the wetted surface. This configuration makes it possible to produce channels which are formed entirely by walls of fusible materials 6, since a thin film 60 resulting from the property of total wetting described above is present on the surfaces of the channel.

A second example of embodiment of a component for implementing the invention will be given in connection with FIGS. 10A-10B.

For this second example, use is made of two fluids 6, 8, of which one is insulating and the other is conductive; the interface is thus manipulated by electrowetting.

Figure 10A:
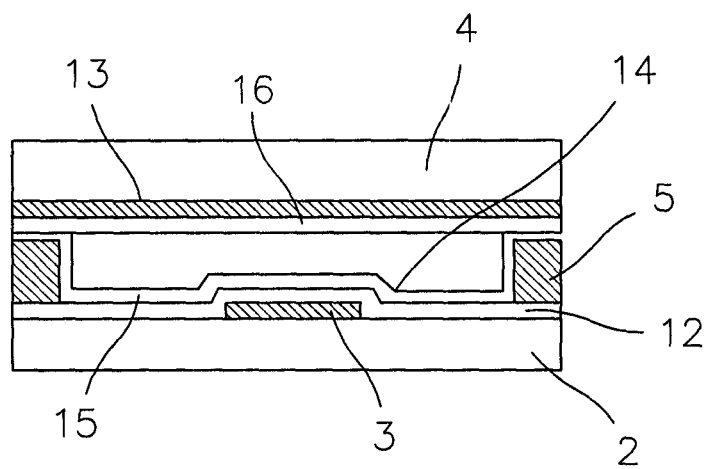

The fluidic component is formed by two parallel plates 2, 4 (FIG. 10A). These plates may be made for example from glass or from silicon.

The lower plate 2 comprises at least one metal layer 3 for defining the electrodes. These electrodes 3 are obtained by depositing and then etching a thin layer of a metal which may be selected from Au, Al, ITO (Indium Tin Oxide), Pt, Cu, Cr, etc. The conventional microtechnologies of microelectronics are used, for example photolithography.

The thickness of the electrodes 3, 13 is from a few tens of nm to a few μm, for example from 10 nm to 10 μm. The width of the motifs is from a few μm to a few mm, for example from 5 μm to 10 mm.

The space 1 between two adjacent motifs is around a few microns, for example between 1 μm and 50 μm.

After structuring of the electrodes, the plate 2 may preferably be covered with an insulating layer 12 for example of $Si_3N_4$, or of $SiO_2$, etc.

A thick layer of resin 5 is deposited for example by lamination of a film of photosensitive resin of the Ordyl type (sold by Elga). The thickness of this film is for example between 10 μm and 500 μm. This layer is then structured by photolithography. This layer makes it possible to define the space between the two plates 2, 4. The motifs of this layer are pillars or beads.

Finally, a hydrophobic layer 14 is preferably deposited, such as for example a deposit of Teflon or of SiOC, as described in the document WO 2007/003720.

The upper substrate 4 comprises a thin metal layer 13, for example selected from Au, Al, ITO (Indium Tin Oxide), Pt, Cu, Cr, etc. Here too, a hydrophobic layer 16 may be deposited, such as for example a deposit of Teflon or of SiOC.

The two plates are pressed together and optionally bonded to one another.

Figure 10B:
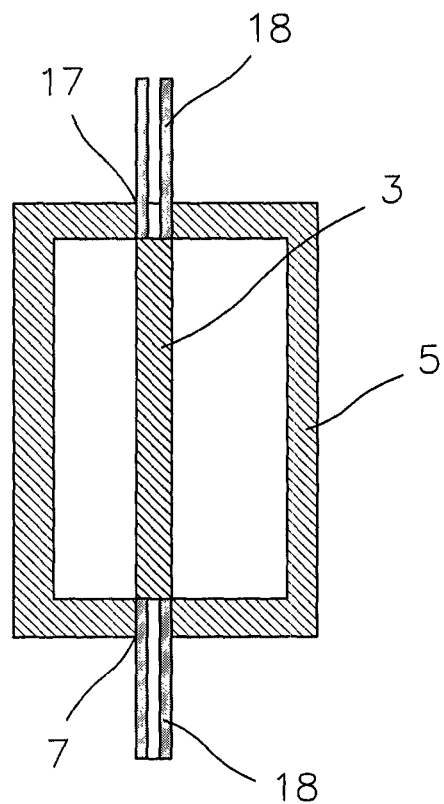

Holes in the upper plate 4 or side openings 7, 17 in the bead of resin 5 are provided for injecting the fluids, for example through capillary tubes 18 adhesively bonded to these orifices (FIG. 10B).

Means (not shown) are provided for forming an electrical interface between the component and an electrical control system. Other means are provided for controlling the temperature of the component. For example, a Peltier-effect element (not shown in the figures) is pressed against the lower plate 2 of the component.

Figure 11A:
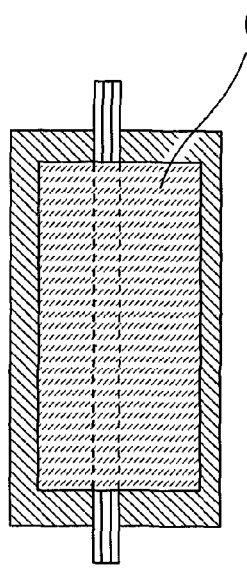
FIGS. 11A-11C show steps for producing another device according to the invention.
Figure 11B:
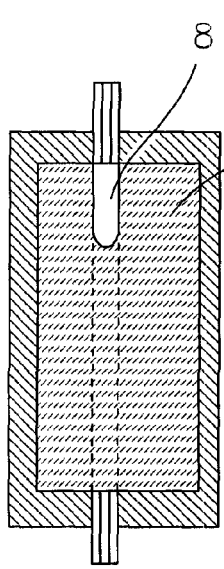

One example of use of this type of component will be given in connection with FIGS. 11A-11C. In this example, the channels have walls made from paraffin, but other materials could be used for the walls.

The component (FIG. 11A) is initially placed at a temperature of 90°. Paraffin 6 is then injected through one of the capillary tubes 18, so as to fill completely the space between the two plates 2, 4. An aqueous solution 8 is injected through this same orifice or another orifice (FIG. 11B), and the electrode 3 is actuated so as to guide by electrowetting the advancing movement of this liquid into the component until it reaches the other end of the component (FIG. 11C).

The shape of the aqueous solution then covers the electrodes 3.

Figure 11C:
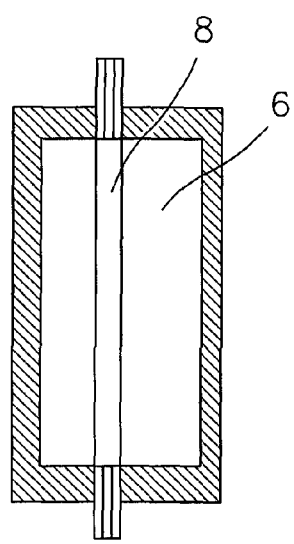

The fusible material 6 can then be solidified: it will thus store the shape obtained, that is to say, in the case of the example in FIG. 11C, a straight channel.

However, as in the previous example, any type of channel geometry can be envisaged by varying the number and geometry of the electrodes 3 of the lower plate.

In all the examples and embodiments described above, the electrodes are in the form of strips. However, the shape of the electrodes can be more complex than these simple strips, so as to form a network of channels with complex geometries. For instance, it is possible to form one or more pillars in a channel and/or one or more closed chambers and/or a convergent then divergent section and/or a narrowing in at least one channel, and/or at least one serpentine-shaped channel, each of these elements being formed in the material 6, which is initially liquid and then solidified or hardened.

Figure 9A:
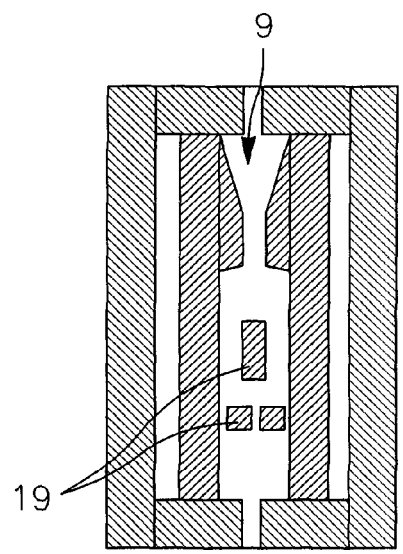
FIGS. 9A-9E show, in a plan view, geometry examples of microfluidic channels and networks, with a convergent/divergent channel and pillars (FIG. 9A), parallel channels (FIG. 9B), communicating or crossing channels (FIG. 9C), a closed chamber (FIG. 9D), and a matrix of electrodes (FIG. 9E), FIGS. 10A, 10B respectively show a sectional view and a plan view of another component according to the invention.
Figure 9B:
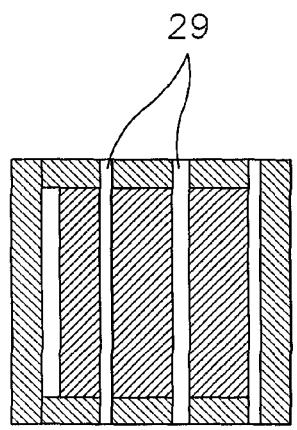
Figure 9C:
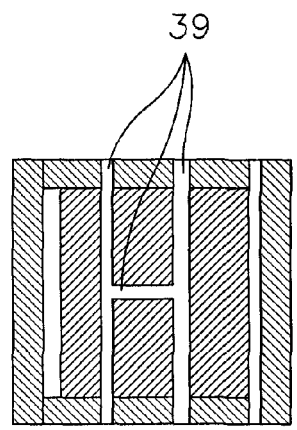
Figure 9D:
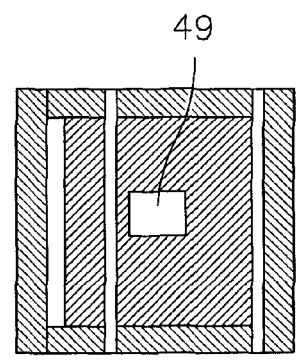

For instance, FIGS. 9A-9E show various embodiments:
  with a channel 9 having a successively convergent then divergent shape, and with pillars 19 on the trajectory (FIG. 9A),
  with parallel channels 29 (FIG. 9B),
  with communicating channels 39 (FIG. 9C),
  with a chamber 49 (FIG. 9D).

Figure 9E:
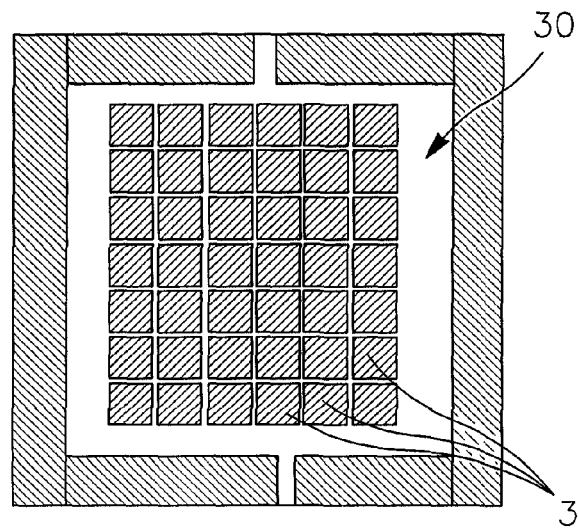

As a variant, shown in FIG. 9E, the array of electrodes 3 of the lower plate 2 may consist of a matrix 30 of electrodes, each pixel of this electrode matrix being able to be addressed independently of the other pixels. This results in a fluidic network formed of channels intersecting at right angles. However, the use can choose just some of the electrodes of this network to be actuated, so as to define by himself the shape of the microfluidic network to be produced. Thus, starting from the same two-dimensional array of electrodes, and in particular of the rows/columns type of FIG. 9E, it is possible to form a large variety of microfluidic networks with varied geometries. The denser the matrix of electrodes, the higher the geometric resolution of the channel and the complexity of the microfluidic networks can be.

Figure 12A:
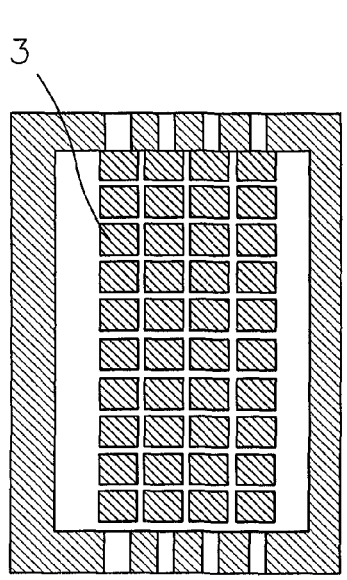
FIGS. 12A-12C show a component comprising a matrix of electrodes for producing fluidic networks of different shapes.
Figure 12B:
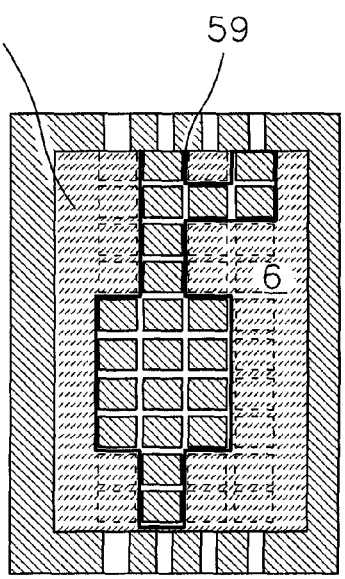
Figure 12C:
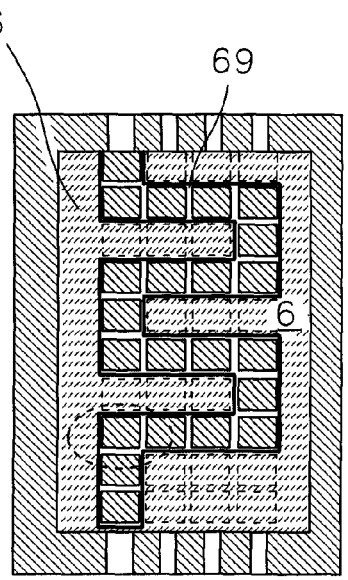

Regardless of the mode of implementation of the invention, FIGS. 12A-12C show examples of channel geometries or of networks 59, 69 of channels which can be formed on one and the same component consisting of a matrix of electrodes 3, shown in plan view in FIG. 12A. It will be understood that, according to FIGS. 12B and 12C, starting from such a matrix, a very large variety of microfluidic networks, for example with a serpentine-shaped channel, can be produced.

As in the first example of embodiment (FIG. 8), it is possible to choose a fusible material 6 in the total wetting configuration. This makes it possible to preserve a very thin film of this material on the surface of the walls 2, 4.

Figure 13A:
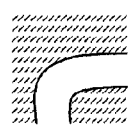
FIGS. 13A-13B show details of channels in a device according to the invention, and in particular a plan view of a portion of a channel having a curvature (FIG. 13A) and a sectional view of a channel (FIG. 13B)
Figure 13B:
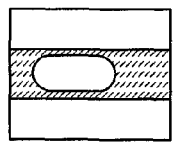

For reasons of simplification of the drawing, the networks of FIGS. 9A-9E and 12A-12C are shown with right angles. In reality, the capillary effects which result from the use of fluids 6, 8 when forming the walls mean that these angles are rounded or curved. Thus, another aim of the invention is to form a microfluidic network while avoiding the angular shapes which are sometimes undesirable in microfluidics since they can lead to dead spaces and/or to effects of the bubble trapping type. FIG. 13A shows an enlarged view of a bend or curvature of a channel formed according to the invention, the non-angular shape of the channel being apparent in this figure. Similarly, the capillarity has an effect of smoothing the channels, resulting in the attenuation of any roughness. FIG. 13B shows a view of a channel in cross-section. The rounded shape can be seen therein, without any roughness or right angles.

Figure 14A:
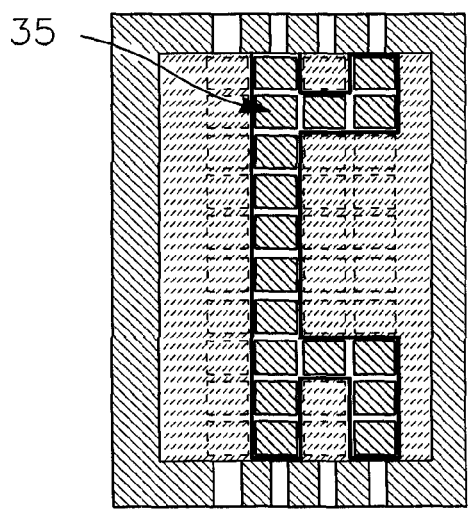
FIGS. 14A, 14B show on the one hand a microfluidic network according to the invention and on the other hand an example of an experiment carried out with this network.
Figure 14B:
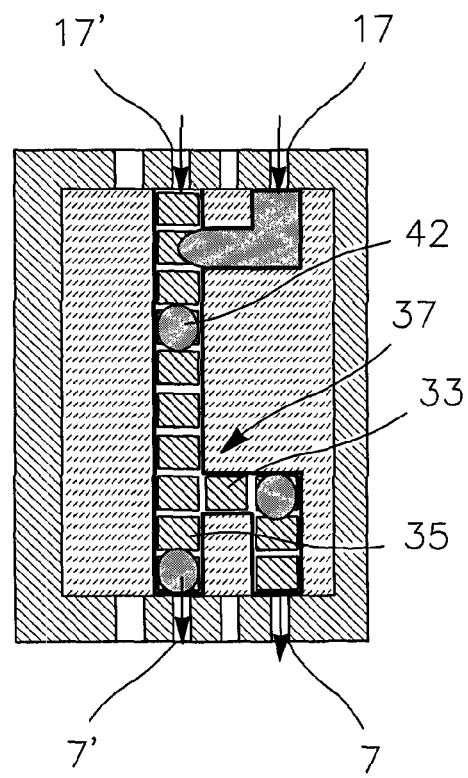

FIGS. 14A-14B show an example of a microfluidics experiment carried out in a channel 9 shaped according to the invention. An aqueous phase is injected through a first orifice 17, and a water-immiscible phase (for example oil, organic solvent, etc.) is injected through a second orifice 17'. At the "T" 35 (FIG. 14A), a hydrodynamic mechanism known in microfluidics makes it possible to form droplets of water 42 (FIG. 14B) of reproducible size. These are then transported by the water-immiscible phase.

The electrodes used to produce the channels may be used again to manipulate the droplets by electrowetting. For instance, at the branching 37, the droplets 42 can be oriented towards one of the two orifices 7, 7' by activating the electrodes 33 or 35 when a droplet 22 is located in the vicinity thereof.

As an example of application, it is possible to test chemical or biological reactions in each droplet. Depending on the result of the reaction, the user can sort the droplets by electrowetting so as for example to discard the droplets which have not reacted and to keep only those which have reacted. This example makes it possible to show that, with the components described by the invention, it is possible to carry out microfluidics of the hydrodynamic type in a channel, or microfluidics based on droplet manipulation by electrowetting. In the example, the droplets are manipulated simultaneously by the hydrodynamic effects and by electrowetting in the same component. Various applications are envisaged for the invention.

For example, the invention makes it possible to obtain a rapid prototyping technique, since the user modifies easily and with a high degree of interactivity the shape of the channels. The optimisation of a design of a microfluidic component is much quicker than with the techniques of the prior art.

The invention moreover makes it possible to carry out successively biological or chemical reactions without having to change the chip, while limiting the risk of contamination between the successive uses. Ultimately, only the medium 6 is the consumable part. Furthermore, a cleaning of the substrate and of the electrodes can be envisaged between two uses.

Potential applications are thus lab-on-a-chip applications, for the analysis field, for example environmental analysis or diagnostics.

The invention claimed is:

1. A method for producing a microfluidic network, including at least a first microfluidic channel, which method comprises:
a) introducing a first fluid and a second fluid between two plates provided with electrodes, these two fluids being immiscible, the first fluid being a liquid that can be hardened or solidified;
b) shaping an interface between the two fluids by the electrodes so as to form at least the first fluidic flow channel; and
c) creating a wall of the first fluidic flow channel by solidifying or hardening a material of the first fluid.

2. A method according to claim 1, the first and second fluids being:
both insulating, with different dielectric permittivities, the constant c of the first fluid being greater than the constant of the second fluid,
or both conductive, or one substantially more conductive than the other,
or one being insulating and the other conductive.

3. A method according to claim 1, the first fluid being an adhesive, or epoxy, or silicone, or a resin, or a UV adhesive, or an insulating adhesive, or a gel, or alginate, or agarose, or a polymer, or PDMS, or a liquid-solid phase change material, or a material having a phase transition temperature between 50° C. and 150° C., or paraffin, or additionally loaded with conductive particles, or polycarbonate, or a metal or an alloy based on tin and/or lead.

4. A method according to claim 1, the second fluid being a gas, or air, or an insulating fluid, or oil, or water, or an aqueous solution.

5. A method according to claim 1, further comprising fluidizing the solidified material of the first fluid.

6. A method according to claim 1, further comprising fluidizing the solidified material of the first fluid, which eliminates the hardened or solidified wall of the first fluidic channel, eliminating the fluidized first fluid, and replacing the eliminated fluidized first fluid with a third fluid that can be hardened or solidified.

7. A method according to claim 1, further comprising fluidizing the solidified material of the first fluid, which eliminates the hardened or solidified wall of the first fluidic channel, repeating the steps b) and c) using the first fluid and the second fluid which is immiscible with the first fluid.

8. A method according to claim 1, further comprising fluidizing the solidified material of the first fluid, which eliminates the hardened or solidified wall of the first fluidic channel, repeating steps b) and c) using the first fluid and the second fluid which is immiscible with the first fluid, the first fluid is shaped by the second fluid and the electrodes so as to form at least a second fluidic flow channel, different from the first fluidic flow channel.

9. A method according to claim 1, the microfluidic network comprising one or more pillars in a channel, and/or one or more closed chambers, and/or a convergent then divergent section, and/or a constriction in at least one channel, and/or at least one serpentine-shaped channel.

10. A method according to claim 1, the electrodes not being buried.

11. A method according to claim 1, the electrodes being buried.

\* \* \* \* \*